United States Patent
Yoshino

[19]

[11] Patent Number: 6,023,741
[45] Date of Patent: Feb. 8, 2000

[54] PULSE WIDTH MODULATION CONTROL WHICH DATA TRANSFER IS INHIBITED BY OVERFLOW SIGNAL

[75] Inventor: Masaki Yoshino, Kanagawa, Japan

[73] Assignee: NEC Corporation, Tokyo, Japan

[21] Appl. No.: 09/020,596

[22] Filed: Feb. 4, 1998

[30] Foreign Application Priority Data

Mar. 25, 1997 [JP] Japan ..................................... 9-071112

[51] Int. Cl.$^7$ ................................................... H03K 3/017
[52] U.S. Cl. ........................................... 710/100; 327/175
[58] Field of Search ................................... 710/100, 129; 327/175, 176

[56] References Cited

U.S. PATENT DOCUMENTS

| | | | |
|---|---|---|---|
| 4,365,202 | 12/1982 | Sinniger . | |
| 5,248,900 | 9/1993 | Davis ...................................... | 327/176 |
| 5,298,871 | 3/1994 | Shimohara . | |
| 5,481,560 | 1/1996 | Parker . | |
| 5,485,487 | 1/1996 | Orbach et al. . | |
| 5,594,631 | 1/1997 | Katoozi et al. . | |
| 5,793,234 | 8/1998 | Cho ........................................ | 327/175 |

FOREIGN PATENT DOCUMENTS 3-228102  10/1991  Japan .............................. G05B 15/02

OTHER PUBLICATIONS

Y. Hirsch, "Applications of Digital PWM Integrated Circuits", IEEE Applied Power Electronics Conference and Exposition, vol. 1, Apr. 28, 1986, pp. 171–177.

*Primary Examiner*—Glenn A. Auve
*Attorney, Agent, or Firm*—Scully, Scott, Murphy & Presser

[57] ABSTRACT

In a pulse width modulation (PWM) control circuit, a free run counter counts a pulse signal to count a value, and generates an overflow signal when the counted value is equal to a predetermined value. A transfer control circuit allows a set value to be transferred from a master compare register to a slave compare register and inhibits the transfer of the set value in response to the overflow signal. A comparing circuit compares the counted value in the free run counter and the set value transferred into the slave compare register and generates a coincident signal when the counted value is coincident with the set value. An output circuit generates a PWM signal in response to the overflow signal and the coincident signal.

17 Claims, 5 Drawing Sheets

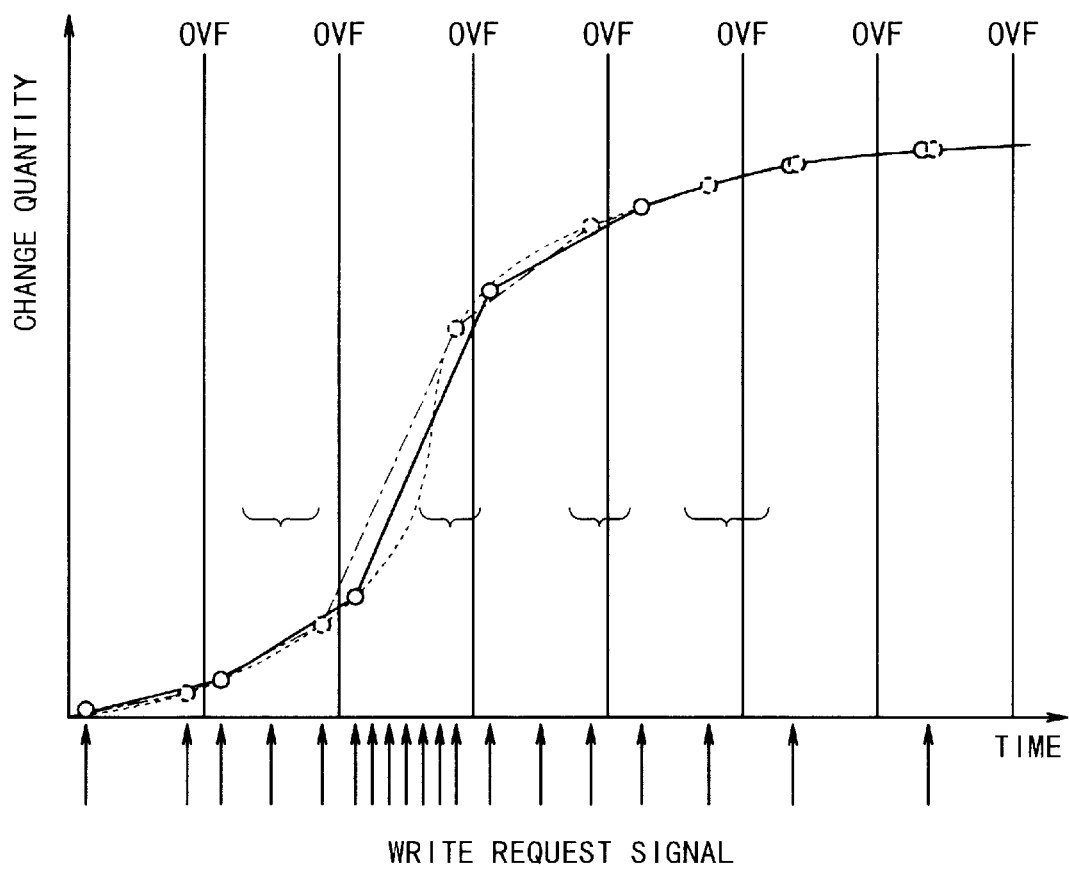

PULSE WIDTH MODULATION CONTROL WHICH DATA TRANSFER IS INHIBITED BY OVERFLOW SIGNAL

BACKGROUND OF THE PRESENT INVENTION

1. Field of the Present Invention

The present invention relates to a pulse width modulation (PWM) control and, more particularly, to PWM control which is used in a meter control.

2. Description of the Related Art

In each of the meters on the dash board of an automobile, a value pointed by a needle of the meter changes in accordance with change in vehicle speed, rotational speed of an engine, or the like. The Pulse Width Modulation (PWM) control is typically used to change the position of the needle of each meter in accordance with the change in vehicle speed, rotational speed of an engine, or the like.

FIG. 1 shows a block diagram illustrating the structure of a conventional meter control circuit, as in Japanese Laid Open Patent Application (JP-A-Heisei 3-228102), for example. Referring to FIG. 1, a set value is written from a bus 210 into a master compare register 203 in response to generation of a write request signal. When a transfer control signal 209s from a transfer control circuit 204 is in a transfer permission state, the set value is transferred from the master compare register 203 to the slave compare register 202 in synchronous with the overflow signal 206s of the free run counter 201. A coincidence signal 207s is generated when a count value of a free run counter 201 and a set value on a slave compare register 202 coincide. Also, the overflow signal 206s is generated when the free run counter 201 overflows. A PWM output signal 208s is formed from the coincidence signal 207s and the overflow signal 206s.

However, when the overflow signal 206s is generated during the writing operation of the set value into the master compare register 203 through the bus 210, there is a possibility that the set value is transferred to the slave compare register 202 through the master compare register 203 on the way of writing operation. For this reason, the transfer control circuit 204 is provided to control the transfer of the set value from the master compare register 203 to the slave compare register 202. Thus, an erroneous operation can be prevented even in the case where the overflow signal 206s is generated during the rewriting operation on the master compare register 203, as mentioned above.

To prevent the erroneous operation in the above circuit structure, the following transfer control is performed. That is, when the transfer control signal 209s is in a transfer permission state, the transfer control circuit 204 permits the set value to be transferred from the master compare register 203 to the slave compare register 202 in synchronous with the overflow signal 206s from the free run counter 201, as shown by an arrow A. On the contrary, the transfer control circuit 204 inhibits the set value from being transferred from the bus 210 to the master compare register 203, as shown by an arrow B.

On the other hand, when the transfer control signal 209s is in a transfer inhibition state, the transfer control circuit 204 inhibits the set value from being transferred from the master compare register 203 to the slave compare register 202, even if the overflow signal 206s is generated from the free run counter 201. On the contrary, the transfer control circuit 204 permits the set value to be written into the master compare register 203 through the bus 210, as shown by the arrow B.

FIG. 2 shows a control flow in the conventional circuit after the write request signal is generated. In the conventional circuit, when a write request signal is generated in a step S32, the transfer control circuit 204 is set in the transfer inhibition state in a software manner in a step S34. Then, the set value is written by a CPU (not shown) to the master compare register 203 through the bus 210 in a step S36. Subsequently, the transfer control circuit is set in the transfer permission state in a software manner in a step S38. The above steps are repeated until the overflow signal is generated. When the overflow signal 206s is generated from the free run counter 201, the transfer of the set value from the master compare register 203 to the slave compare register 202 is executed in synchronous with the overflow signal in a step S40.

FIG. 3 shows a relation between the overflow signals 206s of the free run counter 201 and the write request signals to the master compare register 203. As shown in FIG. 3, the many write request signals are generated between an overflow signal 206s and the next overflow signal 206s from the free run counter 201. In this case, The CPU sets the transfer control circuit 204 into the transfer inhibition state each time the write request signal is generated. Then, the CPU writes a set value into the master compare register 203. Thereafter, the CPU sets the transfer control circuit 204 to the transfer permission state. This processing is repeated each time the write request signal is generated for a time period between the overflow signal 206s and the next overflow signal 206s.

As a consequence, however, only the set value written into the master compare register 203 just before the generation of the overflow signal 206s is transferred to the slave compare register 202. Thereby, the latest set value is reflected to the PWM output signal 208s. That is, the set values other than the value written into the master compare register 203 just before the generation of the overflow signal 206s are not used.

Since the transfer of the set value shown by the arrow A is controlled by the transfer control circuit 204, the set value is not transferred from the master compare register 203 to the slave compare register 202 even when the overflow signal 206s is generated during the writing operation of the value into the master compare register 203. Therefore, there would be a case that the value of the slave compare register 203 is not updated. In this manner, the PWM output signal cannot be not changed in spite that targets to be pointed by the meters such as vehicle speed, rotational speed of the engine, etc. are changed.

As described above, there are the following problems in the conventional circuit.

As a first problem, the CPU performs useless processing. In the conventional circuit, the set value is written to the master compare register through the bus by the number of times of generation of the write request for the time period from a overflow signal and the next overflow signal from the free run counter. However, even if the value is written many times from the bus to the master compare register, only the latest value which has been finally written among them is eventually transferred as a valid value to the slave compare register. Therefore, any values overwritten on the master compare register other than the latest value are not reflected to the PWM output. As a result, the CPU performs the useless processing.

As a second problem, the transfer control circuit 204 controls the transfer of the set value from the master compare register to the slave compare register. Therefore, there would be a case that the set value on the slave compare register is not updated in dependence on a timing. In other words, when the overflow signal is generated from the free run counter during the writing operation of the set value into the master compare register, the transfer of the set value from the master compare register to the slave compare register is not permitted, since the value is being written into the master compare register. Therefore, the set value is not transferred from the master compare register to the slave compare register. Thus, the set value on the slave compare register is not updated and the PWM output signal does not change.

SUMMARY OF THE INVENTION

The present invention is designed to solve the above problems. Therefore, an object of the present invention is to provide a pulse width modulation control circuit.

In order to achieve an aspect of the present invention, a pulse width modulation (PWM) control circuit includes a free run counter for counting a clock signal to count a value, and for generating an overflow signal when the counted value is equal to a predetermined value, a slave compare register for storing a set value, a master compare register for storing the set value, a transfer control circuit for allowing the set value to be transferred from the master compare register to the slave compare register and for inhibiting the transfer of the set value in response to the overflow signal, a comparing circuit for comparing the counted value in the free run counter and the set value transferred into the slave compare register and for generating a coincident signal when the counted value is coincident with the set value, and an output circuit for generating a PWM signal in response to the overflow signal and the coincident signal.

The transfer control circuit may include a transfer control flag which is reset in response to the overflow signal, and may generate a transfer inhibition signal when the transfer control flag is reset. In this case, the transfer of the set value from the master compare register to the slave compare register is inhibited in response to the transfer inhibition signal. Also, the master compare register may receive the set value in response to a write request signal when the transfer inhibition signal is generated.

Also, the transfer control circuit may set the transfer control flag in response to the write request signal to generate a transfer permission signal such that the set value is transferred from the master compare register to the slave compare register. In this case, write of the set value into the master compare register is inhibited in response to the transfer permission signal.

The PWM control circuit may further include a writing section for referring to the transfer control flag to detect whether the transfer control flag is set or reset, and generating the write request signal to write the set value in the master compare register when the transfer control flag is reset.

In order to achieve another aspect of the present invention, a method of reliably generating a pulse width modulation (PWM) signal in a PWM control circuit, includes the steps of:

counting a clock signal to count a value, and generating an overflow signal such that a transfer inhibition mode is set, when the counted value is equal to a predetermined value;

transferring a set value from a master compare register to a slave compare register in a transfer permission mode, the transfer is inhibited in the transfer inhibition mode; and comparing the counted value and the set value transferred into the slave compare register and generating a PWM output signal in the transfer inhibition mode when the counted value is coincident with the set value.

The generation of an overflow signal includes resetting a transfer control flag in response to the overflow signal, such that the transfer inhibition mode is set.

The set value is desirably written into the master compare register in the transfer inhibition mode. In this case, the transfer permission mode is set in response to the writing of the set value into the master compare register. Also, the transfer control flag is set.

In accordance with another aspect of the present invention, a pulse width modulation (PWM) control circuit includes a transfer control flag, a master compare register and a slave compare register, a writing section for referring to the transfer control flag to detect whether the transfer control flag is set or reset, for writing a set value in the master compare register when the transfer control flag is reset, wherein the set value is transferred from the master compare register to the slave compare register when the transfer control flag is set, a free run counter for counting a clock signal to count a value, and for generating an overflow signal to reset the transfer control flag, when the counted value is equal to a predetermined value, and a PWM signal output circuit for comparing the counted value in the free run counter and the set value transferred into the slave compare register and for generating a PWM output signal in response to the overflow signal when the counted value is coincident with the set value.

In order to achieve yet still another aspect of the present invention, a method of outputting a pulse width modulation (PWM) signal corresponding to a set value in a PWM control circuit, comprising the steps of:

counting a pulse signal to generate a counted value;

generating an overflow signal when the counted value is equal to a predetermined value;

writing a set value in a master compare register in a transfer inhibition mode;

transferring the set value from said master compare register to a slave compare register in a transfer permission mode;

resetting the transfer permission mode to the transfer inhibition mode in response to the overflow signal;

comparing said counted value and the set value transferred into the slave compare register to generate a coincident signal when the counted value is coincident with the set value; and outputting a PWM signal in response to the overflow signal and the coincident signal.

The writing step includes generating a write request signal. In this case, the transfer inhibition mode is reset to the transfer permission mode in response to the write request signal. The resetting of the transfer permission mode includes setting a transfer control flag in response to the overflow signal, and the resetting of the transfer inhibition mode includes resetting the transfer control flag in response to the write request signal. In this manner, only the set value corresponding to a first one of the plurality of write request signals is allowed to be written in the master compare register.

BRIEF DESCRIPTION OF THE DRAWINGS

FIG. 7 is a diagram illustrating the relation of transfer of the set value from the master compare register to the slave compare register and the write requests in the PWM control circuit according to the embodiment of the present invention.

DESCRIPTION OF THE PREFERRED EMBODIMENTS

The pulse width modulation (PWM) control circuit of the present invention will be described below in detail with reference to the accompanying drawings.

Figure 4:
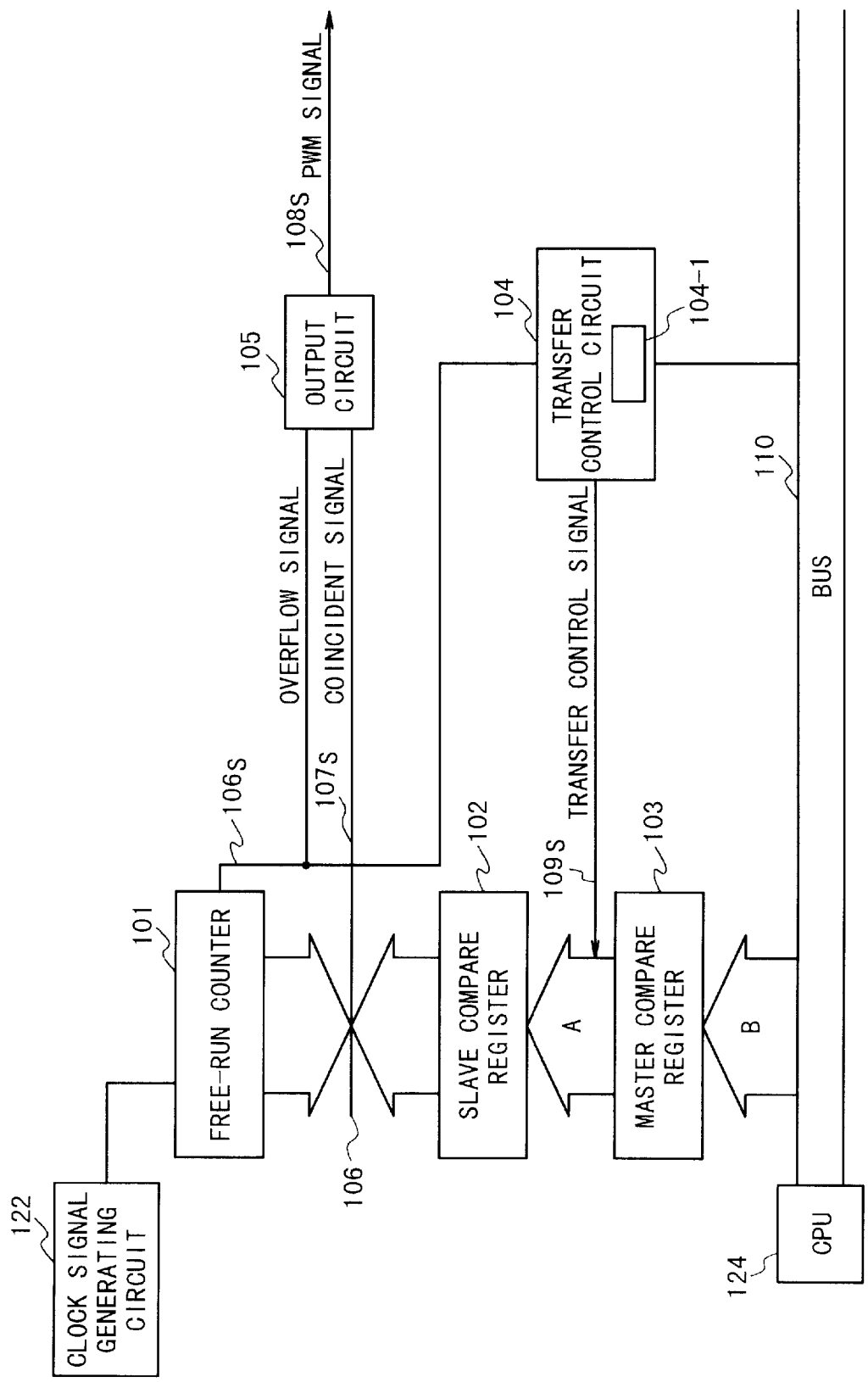
FIG. 4 is a block diagram illustrating the structure of a PWM control circuit according to an embodiment of the present invention.

FIG. 4 shows a block diagram illustrating the structure of a pulse width modulation (PWM) control circuit according to an embodiment of the present invention. Referring to FIG. 4, the PWM control circuit is composed of a free run counter 101, a slave compare register 102, a master compare register 102, a transfer control circuit 104 with a transfer control flag 104-1, an output circuit 105, a comparing circuit 106, a CPU 124 and a clock signal generating circuit 122.

Figure 1:
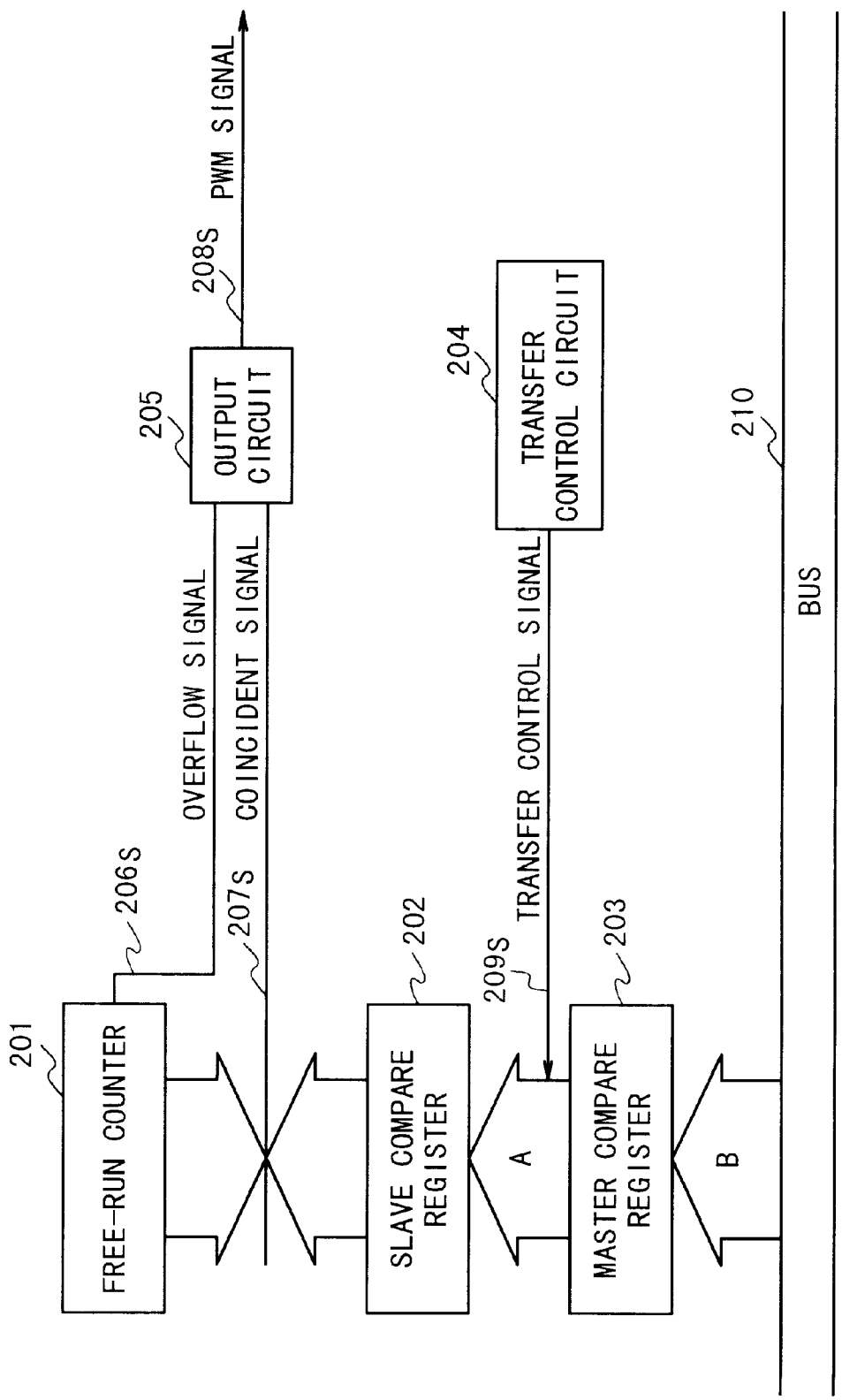
FIG. 1 is a block diagram illustrating the structure of a conventional PWM control circuit.
Figure 2:
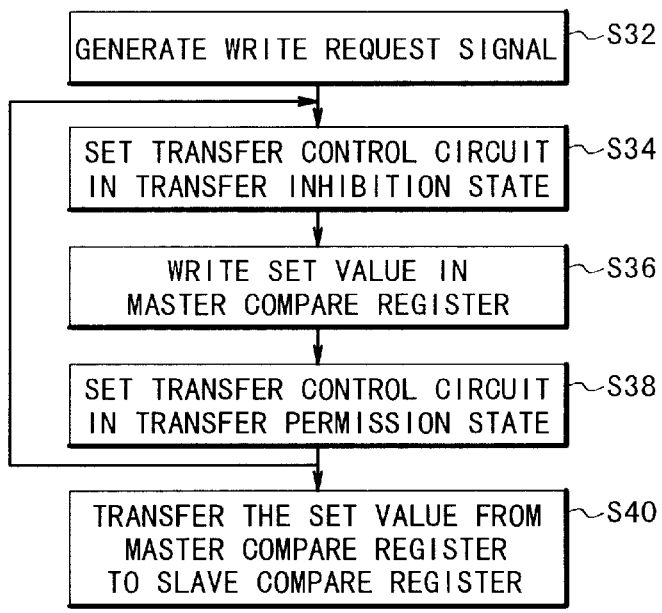
FIG. 2 is a control flow chart illustrating the operation of the conventional PWM control circuit shown in FIG. 1.
Figure 3:
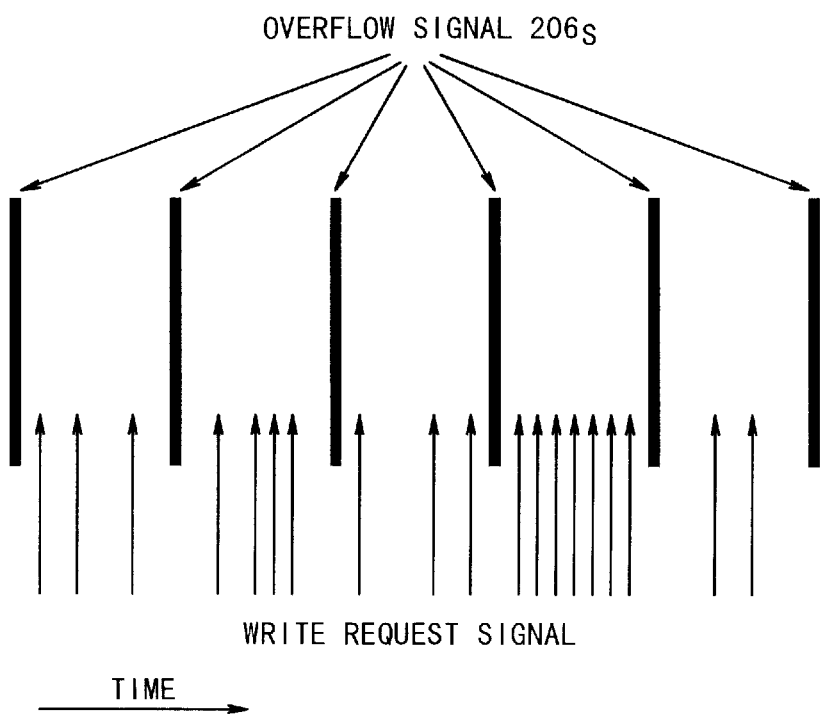
FIG. 3 is a diagram illustrating the relation of overflow signals and write request signals in the conventional PWM control circuit shown in FIG. 1.

As seen from FIG. 4, the PWM control circuit in the embodiment differs from the conventional PWM control circuit shown in FIG. 1 with respect to a point that the overflow signal 106s is connected from the free run counter 101 to a transfer control circuit 104.

The CPU 124 controls the whole operation of the PWM control circuit. The CPU 124 refers to the transfer control flag 104-1 of the transfer control circuit 104. When the transfer control flag 104-1 is reset to a transfer inhibition state or mode, the CPU generates a write request signal and writes a set value into a master compare register 103 through the bus 110 in response to the write request signal. The transfer control flag 104-1 of the transfer control circuit 104 is reset to a transfer permission state or mode in response to the write request signal to output a transfer permission signal. On the other hand, when the transfer control flag 104-1 is set in the transfer permission state, the CPU cannot generate the write request signal. As a result, the set value is never written into the master compare register 103 in the transfer permission mode.

When the transfer control flag 104-1 is set in the transfer permission state, the transfer control circuit 104 outputs a transfer permission signal 109s. The set value is transferred from the master compare register 203 to the slave compare register 202 in synchronous with the overflow signal 206s of the free run counter 201 in response to the transfer permission signal 109s.

The free run counter 101 counts the clock signal from the clock signal generating circuit 122 to generate a counted value, and generates the overflow signal 106s when the counted value is equal to a predetermined value which is set by the CPU 124.

The comparing circuit 106 generates a coincidence signal 207s when the counted value by the free run counter 101 is coincident with the set value transferred to the slave compare register 202. The output circuit 105 generates a PWM output signal 208s from the coincidence signal 207s and the overflow signal 206s.

Also, the transfer control flag 104-1 of the transfer control circuit 104 is reset to the transfer inhibition state in response to the overflow signal 206s to output the transfer inhibition signal 109s.

To prevent the erroneous operation in the above circuit structure, the following transfer control is performed. That is, when the transfer control signal 209s is in a transfer permission state, the transfer control circuit 204 permits the set value to be transferred from the master compare register 203 to the slave compare register 202 in synchronous with the overflow signal 206s from the free run counter 201, as shown by an arrow A. On the contrary, in the transfer permission state, the CPU does not generates the write request signal. Therefore, the set value is not written into the master compare register 203, as shown by an arrow B.

On the other hand, when the transfer control signal 209s is in a transfer inhibition state, the transfer control circuit 204 inhibits the set value from being transferred from the master compare register 203 to the slave compare register 202, even if the overflow signal 206s is generated from the free run counter 201. On the contrary, the transfer control circuit 204 permits the CPU to generate the write reques signal and to write the set value into the master compare register 203 through the bus 210, as shown by the arrow B.

In this manner, in this embodiment, the transfer control signal 109s of the transfer control circuit 104 is reset (transfer is inhibited) by the overflow signal 106s in a hardware manner and only the setting operation (transfer is permitted) is executed in a software manner.

Figure 5:
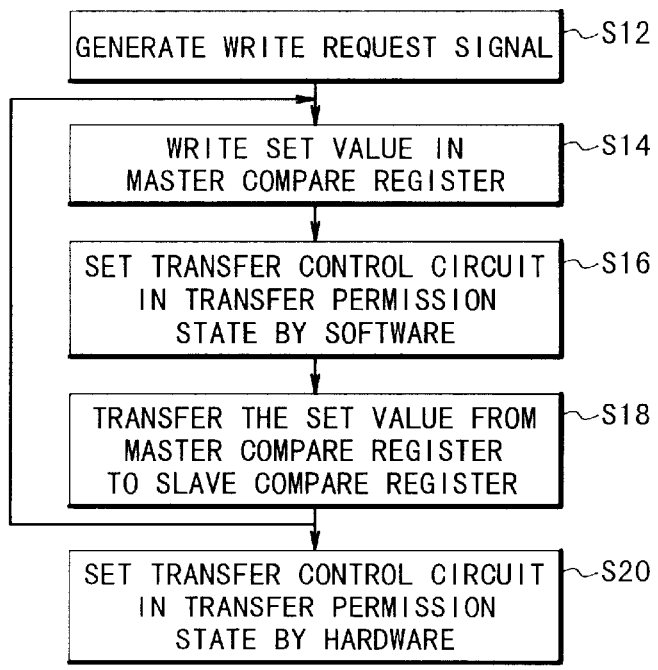
FIG. 5 is a control flow chart illustrating the operation of the PWM control circuit according to the embodiment of the present invention.

FIG. 5 shows a control flow for explaining the operation of the PWM control circuit of the present invention.

The CPU 124 refers to the transfer control flag 104-1 of the transfer control circuit 104. When the transfer control flag 104-1 is reset to a transfer inhibition state or mode, the CPU 124 generates a write request signal in a step S12 and writes a set value into a master compare register 203 through the bus 110 in response to the write request signal in a step S14. The transfer control flag 104-1 of the transfer control circuit 104 is set in a transfer permission state in response to the write request signal in step S16 to output a transfer permission signal.

The set value is transferred from the master compare register 103 to the slave compare register 102 in the transfer permission state in response to the transfer permission signal in a step S18.

Thereafter, the overflow signal is generated from the free run counter 101 and then the PWM signal is outputted from the output circuit 105 as described above. The transfer control flag 104-1 of the transfer control circuit 104 is reset to the transfer inhibition state in a step S20 to output the transfer inhibition signal 109s.

As described above, the transfer control flag 104-1 is reset in a hardware manner. Therefore, in a software manner, it is sufficient to execute only a control to set the transfer control circuit 104 into the transfer permission state after the set value has been written to the master compare register 103.

Figure 6:
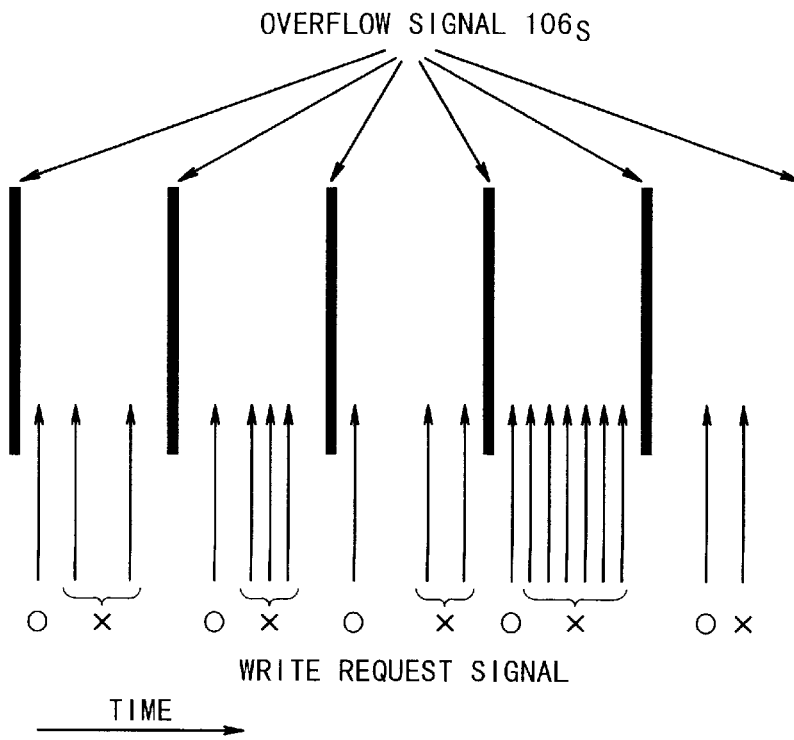
FIG. 6 is a diagram illustrating the relation of overflow signals and write request signals In the PWM control circuit according to the embodiment of the present invention.

FIG. 6 shows a relation between write request signals and the writing operations to the master compare register 103 through the bus 110. When only the transfer permission is controlled in the software manner in accordance with the control flow of FIG. 5, only the write request signal just after the overflow signal 106s is validated. On the contrary, the subsequent write request signals before generation of the overflow signal are invalidated. At the same time, the transfer control flag is always checked by the CPU. Only when it is confirmed that the transfer control signal 109s is set in the transfer inhibition state, the writing operation of the set value to the master compare register 103 is carried out. Thus, the writing operation of the set value from the bus 110 to the master compare register 103 is carried out only once for a period of time between the overflow signal 106s and the next overflow signal 106s. Subsequent, the set value is transferred from the master compare register 103 to the slave compare register 102.

FIG. 7 shows a change quantity of a target such as vehicle speed, rotational speed of a engine, and the like in the PWM control and the set values which are transferred from the master compare register 103 to the slave compare register 102. In FIG. 7, an alternate long and short dash line indicates the change quantity in the conventional circuit. The dash line indicates a target change quantity. The solid line indicates the change quantity in the PWM control circuit of the present invention.

In the conventional circuit shown in FIG. 1, whenever the write request signal is generated, the set value is written from the bus 210 to the master compare register 203. As a result, the last set value between the overflow signal 206s and the next overflow signal 206s is transferred from the master compare register 203 to the slave compare register 202.

On the other hand, according to the circuit of the present invention, after the overflow signal 106s is generated, only the first write request is validated and the first set value is written to the master compare register 103 through the bus 110. Then, the set value is transferred from the master compare register 103 to the slave compare register 102 in response to the next overflow signal 106s. The subsequent write request signals are invalidated.

As seen from FIG. 7, in the present invention, the PWM control can be accomplished more precisely than in the conventional circuit. Even if a timing when the set value is transferred from the master compare register to the slave compare register is fluctuated, it is possible to accomplish the PWM control with higher precision.

By using the PWM control circuit of the present invention, a control can be performed to validate only the first write request signal after the generation of the overflow signal from the free run counter. Also, the set value is written from the bus to the master compare register in response to only the first write request signal after the generation of the overflow signal. After that, even if the write request signals are generated for a period of time until the generation of the next overflow signal, they are invalidated and the writing of the set value from the bus to the master compare register is not executed. Thus, even if the write request signals are generated for a period of time between the overflow signal and the next overflow signal, the writing operation of the set value from the bus to the master compare register is executed only once. Then, the set value is transferred to the slave compare register. Thus, the master compare register is not overwritten and the vain overwriting operation of the CPU is prevented.

Since only the first write request signal after the overflow signal from the free run counter is validated and the set value is written from the bus to the master compare register, there is an enough time until the generation of the next overflow signal. Therefore, the generation of the overflow signal during the writing operation of the set value from the bus to the master compare register can be avoided. Thus, inconvenience can be prevented in which the set value is not transferred from the master compare register to the slave compare register.

What is claimed is:

1. A pulse width modulation (PWM) control circuit comprising:
   a free run counter for counting a pulse signal to generate a counted value, and for generating an overflow signal when said counted value is equal to a predetermined value;
   a slave compare register for storing a set value;
   a master compare register for storing said set value;
   a transfer control circuit having a transfer permission mode for allowing said set value to be transferred from said master compare register to said slave compare register in response to the overflow signal, and for preventing a new set value from being entered into the master compare register, and a transfer inhibition mode for inhibiting the transfer of said set value from the master compare register to the slave compare register in response to said overflow signal and for allowing a new set value to be entered into the master compare register;
   a comparing circuit for comparing said counted value in said free run counter and said set value transferred into said slave compare register and for generating a coincident signal when said counted value is coincident with said set value; and
   an output circuit for generating a PWM signal in response to said overflow signal and said coincident signal.

2. A PWM control circuit according to claim 1, wherein said transfer control circuit includes a transfer control flag which is reset in response to said overflow signal, and generates a transfer inhibition signal when said transfer control flag is reset, and
   wherein the transfer of said set value from said master compare register to said slave compare register is inhibited in response to said transfer inhibition signal.

3. A PWM control circuit according to claim 2, wherein said master compare register receives said set value in response to a write request signal when said transfer inhibition signal is generated.

4. A PWM control circuit according to claim 3, wherein said transfer control circuit sets said transfer control flag in response to said write request signal to generate a transfer permission signal such that said set value is transferred from said master compare register to said slave compare register.

5. A PWM control circuit according to claim 4, wherein write of said set value into said master compare register is inhibited in response to said transfer permission signal.

6. A PWM control circuit according to claim 5, further comprising writing means for referring to said transfer control flag to detect whether said transfer control flag is set or reset, and generating said write request signal to write said set value in said master compare register when said transfer control flag is reset.

7. A method of reliably generating a pulse width modulation (PWM) signal in a PWM control circuit, comprising the steps of:
   counting a pulse signal to count a value, and generating an overflow signal when said counted value is equal to a predetermined value;
   in a transfer permission mode, transferring a set value from a master compare register to a slave compare register in response to the overflow signal and preventing a new set value from being entered into the master compare register;

in a transfer inhibition mode, inhibiting the transfer of a set value from the master compare register to the slave compare resister in response to the overflow signal and allowing a new set value to be entered into the master compare register;

comparing said counted value and said set value transferred into said slave compare register and generating a PWM output signal in said transfer inhibition mode when said counted value is coincident with said set value.

8. A method according to claim 7, wherein said step of generating an overflow signal includes resetting a transfer control flag in response to said overflow signal, such that said transfer inhibition mode is set.

9. A method according to claim 7, further comprising the step of writing said set value into said master compare register in said transfer inhibition mode.

10. A method according to claim 9, further comprising the step of setting said transfer permission mode in response to the writing of said set value into said master compare register.

11. A method according to claim 10, further comprising the step of setting said transfer permission mode includes setting a transfer control flag.

12. A pulse width modulation (PWM) control circuit comprising:

a transfer control flag;

a master compare register and a slave compare register;

writing means for referring to said transfer control flag to detect whether said transfer control flag is set or reset, for writing a set value in said master compare register when said transfer control flag is reset, wherein said set value is transferred from said master compare register to said slave compare register when said transfer control flag is set;

a free run counter for counting a pulse signal to count a value, and for generating an overflow signal to reset said transfer control flag, when said counted value is equal to a predetermined value; and a PWM signal output circuit for comparing said counted value in said free run counter and said set value transferred into said slave compare register and for generating a PWM output signal in response to said overflow signal when said counted value is coincident with said set value.

13. A PWM control circuit according to claim 12, wherein said writing means sets said transfer control flag in response to said writing of said set value into said master compare register.

14. A method of outputting a pulse width modulation (PWM) signal corresponding to a set value in a PWM control circuit, comprising the steps of:

counting a pulse signal to generate a counted value;

generating an overflow signal when said counted value is equal to a predetermined value;

writing a set value in a master compare register and inhibiting a transfer of a set value from said master compare register to a slave compare register in a transfer inhibition mode;

inhibiting a writing of a set value in the master compare register and transferring said set value from said master compare register to a slave compare register in a transfer permission mode;

resetting said transfer permission mode to said transfer inhibition mode in response to said overflow signal;

comparing said counted value and said set value transferred into said slave compare register to generate a coincident signal when said counted value is coincident with said set value; and outputting a PWM signal in response to said overflow signal and said coincident signal.

15. A method according to claim 14, wherein said writing step includes generating a write request signal, and wherein said method further includes resetting said transfer inhibition mode to said transfer permission mode in response to said write request signal.

16. A method according to claim 15, wherein said step of resetting said transfer permission mode to said transfer inhibition mode includes setting a transfer control flag in response to said overflow signal, and wherein said step of resetting said transfer inhibition mode to said transfer permission mode includes resetting said transfer control flag in response to said write request signal.

17. A method according to claim 15, wherein said step of resetting said transfer inhibition mode to said transfer permission mode includes allowing only said set value corresponding to a first one of a plurality of said write request signals to be written in said master compare register.

* * * * *